United States Patent [19]

Russell et al.

[11] 4,316,279
[45] Feb. 16, 1982

[54] OPTICAL RECORDING IN THIN PHOTORESIST

[75] Inventors: John P. Russell, Pennington; Arthur H. Firester, Skillman; Istvan Gorog, Princeton, all of N.J.

[73] Assignee: RCA Corporation, New York, N.Y.

[21] Appl. No.: 16,111

[22] Filed: Feb. 28, 1979

[30] Foreign Application Priority Data

Sep. 4, 1978 [GB] United Kingdom ............... 35510/78

[51] Int. Cl.³ .................... G11B 7/00; G11B 11/12
[52] U.S. Cl. ..................................... 369/109; 369/13; 369/126; 369/275; 369/276
[58] Field of Search ............ 179/100.3 V, 100.3 A, 179/100.3 R, 100.1 G, 100.4 C; 358/127, 128.5, 128.6, 130, 131, 132; 346/108–110 R, 76 L, 135; 430/4, 270, 275, 277, 312–314, 320–321; 369/13, 18, 109, 126, 275, 276

[56] References Cited

U.S. PATENT DOCUMENTS

| | | | |
|---|---|---|---|
| 3,665,483 | 5/1972 | Becker et al. ...................... | 346/76 L |
| 3,943,302 | 3/1976 | Johnston, Jr. ................. | 179/100.4 C |
| 3,968,326 | 7/1976 | Nosker et al. ............... | 179/100.1 G |
| 4,097,895 | 6/1978 | Spon ........................... | 179/100.3 V |
| 4,150,398 | 4/1979 | Kojima et al. ................ | 179/100.4 C |
| 4,152,726 | 5/1979 | Kojima et al. ................ | 179/100.4 C |
| 4,206,477 | 6/1980 | Gorog et al. ..................... | 358/128.5 |

FOREIGN PATENT DOCUMENTS

52-11903  1/1977  Japan .......................... 179/100.1 G

OTHER PUBLICATIONS

Video Disk Mastering, Keizer, RCA Review, vol. 39, pp. 60–86, 3/78.
Gorog, "Optical Techniques Developed for the RCA Video Disc", RCA Review, vol. 39, 3/78, pp. 162–185.

*Primary Examiner*—Raymond F. Cardillo, Jr.
*Attorney, Agent, or Firm*—E. M. Whitacre; J. S. Tripoli; J. E. Roehling

[57] ABSTRACT

A method of producing an information storage disc by optical techniques includes the steps of coating a flat, reflective disc surface with a thin coating of radiant energy sensitive material, moving the coated disc relative to a coherent light beam, which is intensity modulated with the information to be recorded, to expose the radiant energy sensitive material, and developing the radiant energy sensitive material to form a track having geometric variations in the disc representative of the modulated information signals.

10 Claims, 7 Drawing Figures

OPTICAL RECORDING IN THIN PHOTORESIST

This invention relates to novel light beam recording methods for use in the recording of signal information on storage media and more particularly to novel optical methods of recording video and audio signal information onto master disc records having thin coatings of photoresist.

In U.S. Pat. No. 3,842,194, issued on Oct. 15, 1974 to Jon K. Clemens, video disc playback systems of a variable capacitance form are disclosed. In an arrangement therein described, an information track incorporates geometric variations in the bottom of a spiral groove in a disc, the surface of which comprises conductive material covered with a thin coating of dielectric material. Variations in the capacitance presented between a conductive electrode on a tracking stylus and the conductive material of the disc occur as the disc is rotated by a supporting turntable; the capacitance variations are sensed to recover the recorded information.

In one format employed for the groove bottom information track in practice of the Clemens invention, depressed areas extending across the groove bottom alternate with nondepressed areas, with the frequency of alternation varying with the amplitude of video signals subject to recording. The form of the recorded signal is thus a carrier frequency modulated in accordance with video signals.

Optical techniques may be utilized for recording the aforementioned signal on a disc master. Specifically, a composite color video signal, including audio accompaniment and synchronizing signals is used to modulate a carrier signal. The modulated carrier signal is then used to intensity modulate a scanning laser beam. As successive groove bottom regions of a grooved disc master, coated with a layer of light sensitive material (forming a smoothly curved surface for the groove), pass through the laser beam path, the regions are exposed in a pattern determined by the intensity controlling signal. Upon subsequent development, a relief pattern of geometric variations corresponding to the exposure pattern is established in the groove bottom of the disc master.

A stamper disc may be derived from the recording master, by techniques described in the Clemens patent, and utilized, through conventional record stamping machinery, to produce a plurality of replica discs of thermoplastic material. Each replica disc has a surface groove with a relief pattern of geometric variations, corresponding to the pattern of the video disc master, in the bottom thereof.

A significant element of an optical recording system as described above is the ability of the recording lens to form the laser beam into a tightly focused spot. The finite size of the focused spot effects an exposure on the master disc surface of areas which should not be exposed (i.e., the "on" recording beam overlaps in the "off" regions). Thus, the overall response of the system is affected such that the response tends to roll off at high spatial frequencies where the spatial frequency is a function of the temporal frequency of the recording signal, the frequency of rotation of the disc and the radial position of the recording beam on the disc.

In an ideal optical recording system using a trapezoidally grooved master disc having a thick (e.g., 2 $\mu$m.) photoresist coated thereon where the recording beam is turned on and off in response to the input signal, the information track geometry would consist of an undisturbed groove bottom interleaved with geometric variations or "pits" of substantially uniform depth. In an optical recorder where the recording beam width is not negligible compared with the signal wavelength, however, the pits tend to become shallower at high spatial frequencies due to the nonuniform frequency dependent response. The effect of this nonuniform response is to introduce "signal track drop" into the record master during recording.

In the playback of a video disc with a stylus as disclosed in the Clemens patent, the signal track drop results in a variation in the spacing between the stylus electrode bottom and the groove bottom. Since the dielectric support portion of the stylus is desirably of considerably greater length (along the groove) than the conductive electrode portion, the stylus will ride on the upper surface of the groove. As a consequence, the maximum distance between the stylus electrode bottom (in a direction perpendicular to the plane of the record) and the groove bottom (i.e., signal tops) is primarily determined by the height of the groove bottom at low modulation frequencies (at low modulation frequencies there is little or no track drop). When signal track drop is encountered undesirable variations in the spacing between the stylus electrode bottom and the groove bottom result.

These spacing variations affect the recovered signal by introducing amplitude and phase interference therein. Although the amplitude modulation is tolerable to a considerable degree (i.e., the influence of these components can be reduced by limiter circuitry preceding the FM demodulator in the playback apparatus), the phase modulation which cannot be removed effectively introduces an interfering component in the output signal.

In U.S. Patent Application Ser. No. 938,234, filed Aug. 30, 1978, in the name of I. Gorog et al., now U.S. Pat. No. 4,206,477, apparatus is described for effectively removing signal track drop. In an arrangement described therein, a predistorted signal is recorded simultaneously with the grooves.

In accordance with the principles of the present invention, signal track drop is effectively removed by recording the information signals on a flat substrate which has been thinly coated with a radiant energy sensitive material (e.g., photoresist such as Shipley AZ1350B). In this technique the nonlinear exposure characteristics of the photoresist, the thickness of the photoresist, the interference pattern established by optical reflection at the surface of the substrate by the recording beam and the development time are coordinated to provide a record master.

In further accordance with the present invention, a method of recording information signals modulated within a given frequency range (illustratively, 4.3–6.3 MHz) on a flat reflective storage medium is provided. In this method, a coherent light beam of a given wavelength incident on the flat substrate is intensity modulated in accordance with the modulated information signals. The interaction of the incident and reflected light beam form an optical standing wave at the surface of the substrate and throughout the photoresist. The method comprises coating one surface of a substantially reflective substrate with a uniform layer of nonlinear radiant energy sensitive material to a thickness typically greater than the first standing wave maximum of the optical standing wave in the radiant energy sensitive material but less than the first standing wave minimum of the optical standing wave. Afer coating the substrate, the substrate is moved relative to the intensity modulated light beam to expose the radiant energy sensitive material with the modulated coherent light beam in a pattern representative of the modulated information. Finally, the exposed radiant energy sensitive material is developed for a time period, depending on both the thickness of the radiant energy sensitive material and its exposure, sufficient to form a track having geometric variations therein representative of the modulated information in the radiant energy sensitive material. The aforementioned method effects the production of an information storage medium wherein the depth of the geometric variations at the high frequency end of the given frequency range are substantially equal to the depth of the geometric variations at the low frequency end of the given frequency range.

As mentioned previously, it is sometimes desirable to record information signals on a trapezoidally grooved, photoresist coated, storage medium. It has been observed, however, that recording in such a medium can produce microscopic signal element nonuniformities as well as signal track drop.

In further accordance with the principles of the present invention, a method of optically recording information signals modulated within a given frequency range on a grooved storage medium is provided in which the microscopic nonuniformities and signal track drop are effectively removed. In this method, a coherent light beam of a given wavelength incident on a surface of the storage medium interacts with the reflected light beam to form an optical standing wave in the storage medium. The method comprises forming a groove having a cusp-shaped cross section on one surface of a substrate. After grooving, the grooved surface of the substrate is conformally coated with a uniform layer of partially absorbing, nonlinear radiant energy sensitive material to a thickness greater than the first standing wave maximum of the optical standing wave in the radiant energy sensitive material but less than first standing wave minimum of the optical standing wave. The coated substrate is then moved relative to the light beam while the coherent light beam is simultaneously intensity modulated with the modulated information signals to expose the radiant energy sensitive material along the groove with the intensity modulated light beam in a pattern representative of said modulated information. The exposing step is followed by a developing step as described above.

In accordance with yet another principle of the present invention, a method is provided for optically recording modulated information signals on a cusp-shaped grooved substrate where the radiant energy sensitive material does not conformally coat the groove. In this method, the coherent light beam radial intensity profile is shaped to compensate for radial variations in the thickness of the radiant energy sensitive material within the cusped groove.

Further aspects of the present invention will be apparent from the more detailed description which is described with reference to the accompanying drawing.

In the accompanying drawing:

FIG. 1 is a cross-sectional view of a portion of an information track illustrating track drop;

FIG. 2 provides a representation of the intensity profile of a standing wave at the surface of a reflective substrate;

FIG. 3 defines a two-dimensional boundary for development time and photoresist thickness;

Figure 1:
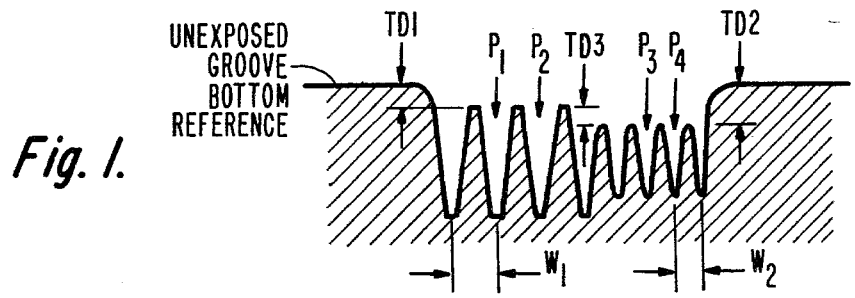

The format employed for a groove information track using a capacitive stylus as practiced in the aforementioned Clemens patent is remarkably tolerant of variations in signal element geometry and stylus characteristics. Capacitive stylii are, however, nonlinear and read the recorded information with an amplitude and phase response that depends on the height of the stylus over the surface. To insure an acceptable signal-to-noise ratio in playback, the signal geometry must be maintained within certain limits. FIG. 1 illustrates a cross-sectional view of an information track. A recording system where a constant amplitude recording signal is employed produces pit regions of relatively shallow depth (illustratively $P_3$, $P_4$ in FIG. 1) at a high spatial frequency such as $1/W_2$ in FIG. 1 where the spatial frequency $1/W$ is a function of the instantaneous modulation frequency (f) of a high frequency FM modulator, the disc rotation rate, and the radial position of the recording beam on the surface of the disc record. At lower spatial frequencies, such as $1/W_1$ in FIG. 1, pit regions of deeper depth are produced (illustratively, $P_1$, $P_2$ in FIG. 1). Since the average light beam intensity for an optical recorder is constant for the range of frequencies to be recorded, a track drop TD1 is effected at the low spatial frequency $1/W_1$, a track drop TD2 is effected at the high spatial frequency $1/W_2$ and a relative track drop TD3 is effected between signal elements at the low spatial frequency and signal elements at the high spatial frequency.

It has been discovered that track drop, and therefore the signal geometry, can be maintained within acceptable limits by taking advantage of the nonlinear characteristics of the photoresist coated on the storage medium and the interference effect of the incident recording light beam (e.g., laser) during the optical recording process.

Figure 2:
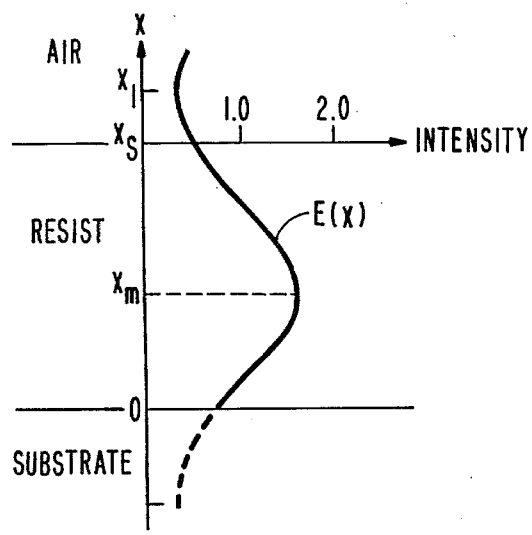

FIG. 2 illustrates the interference pattern established at the surface of a reflective substrate by a coherent light beam incident on said surface. E(x) denotes the optical energy density as a function of the coordinate x. The solid-line portion of the E(x) curve defines a standing-wave pattern at the surface of a substrate and the dotted portion defines an analytical continuation of this pattern inside the substrate. The energy density is normalized so that in the absence of standing waves the total exposure is unity at the point of signal maximum. The optical standing wave established at the surface of the substrate also describes a standing wave established in a weakly-absorbing photoresist coated on the surface thereof. For simplicity, the standing wave shown in FIG. 2 disregards reflections at the air-resist boundary and absorption in the photoresist. The resist thickness $x_s$ is chosen to be less than $x_1$ which is the first minimum of the standing wave and greater than $x_m$ which is the first maximum of the standing wave. For a 442 nm wavelength, HeCd recording laser having a wavelength of 268 nm in a typical photoresist (e.g., Shipley AZ1350B positive photoresist) $x_1$ is chosen to be less than 134 nm which is $\lambda/2$. The reflectivity of typical substrates (e.g., copper) is less than unity and thus as shown in FIG. 2 a standing wave minimum is not located at the substrate-resist interface.

Figure 3:
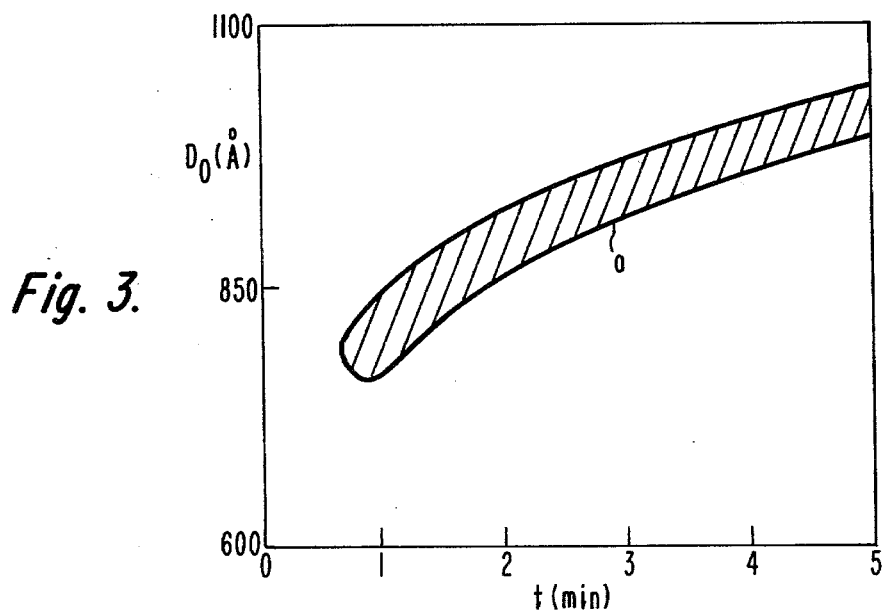
Figure 4:
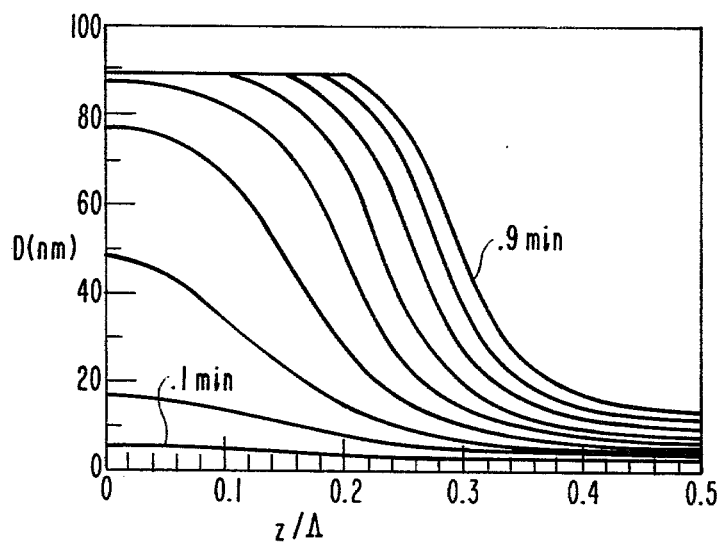
FIG. 4 shows signal profiles at various stages of the development process.

The rate of photoresist development is, in general, a nonlinear function of exposure. The nonlinear development characteristic and the standing wave pattern established in a photoresist provide an opportunity to make a significant improvement in the frequency response of the recording system by matching the photoresist thickness and development time. The shaded space "a" shown in FIG. 3 defines a two-dimensional boundary for photoresist depth $D_0$ (in angstrom units) and development time in minutes within which, for a given set of signal standards, the signal geometry can be maintained within acceptable limits. Of course, it should be noted that the development times as disclosed in FIG. 3 are not absolute and can be adjusted by appropriate dilution of the developer. FIG. 4 illustrates the evolution of the signal pattern during development. For a resist thickness of approximately 90 nm, the signal profiles are plotted in 0.1 of a minute intervals between 0.1 and 0.9 of a minute development time.

Figure 5:
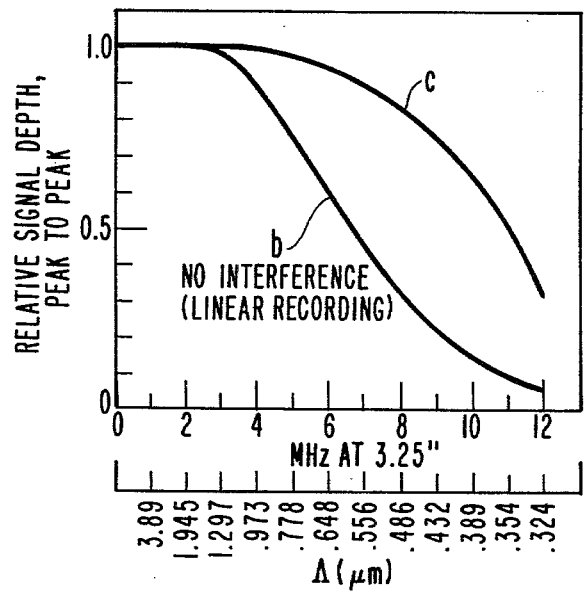
FIG. 5 illustrates in graphical form the relative signal element depth for signals recorded in a thick photoresist and signals recorded in a thin photoresist in accordance with the principles of the instant invention.

FIG. 5 demonstrates the calculated improvement of the high frequency response of an optical recorder using a 300 nm full-width-at-half-intensity Gaussian recording light beam (FWHI) as a result of matching the nonlinearity and interference effects. The ordinate of FIG. 5 defines the relative signal depth, peak-to-peak, while the abscissa defines the modulation frequency for a disc record at the 3.25" radius turning at 450 RPM. The spatial wavelengths (W) which correspond to the modulation frequencies are also indicated on the abscissa of FIG. 5. Curves b and c illustrate the relative signal depth for a disc master where the recording is made on a thickly coated substrate without standing wave enhancement and where the recording is made in accordance with the principles of the present invention respectively. The difference between curves b and c show an improvement from 0.35 to 0.85 relative response at a 0.5 micron spatial wavelength by utilizing the techniques of the instant invention. The significance of the above frequency-response improvement can be further appreciated by reference to a specific example. In the Clemens system, the ratio of the depth of the 6.3 MHz signal elements to the depth of the 4.3 MHz signal elements advantageously is to be greater than 0.7. In the absence of matching standing waves and non-linearities, 0.76 microns, which corresponds to 6.3 MHz at a 4" recording radius, is the shortest signal wavelength recordable with a 300 nm FWHI Gaussian beam. In accordance with the instant invention, this short wavelength limit can be extended down to 0.40 microns corresponding to 6.3 MHz at a radius of 2.1".

One explanation for the improvement in frequency response is as follows. The presence of nonlinearities increases the differential rate of development between high and low exposure regions of the resist. This differential rate can then be utilized to flatten the frequency response by choosing a combination of resist thickness and development time such that in regions of maximum signal, the resist is developed down to the substrate before significant development can occur in regions of minimum signal. Furthermore, during development, the signal pit will reach the substrate first in the regions of low-frequency-signal maxima. With further development, the regions of high-frequency-signal maxima will eventually also reach the substrate surface, and, at that time, the pit depths at the low- and high-frequency-signal maxima are equal.

The foregoing assumes that the initial resist thickness is less than the first interference minimum. If the resist thickness is greater than the first interference minimum, then a standing wave minimum may occur inside of the resist. With sufficient substrate reflectivity, the exposure at this standing-wave minimum is sufficiently small to inhibit development beyond the first minimum encountered by the growing signal pit during development. Thus, the signal depth will be effectively clipped at the plane of this minimum. Using a photoresist which is thicker than the first interference minimum protects the substrate throughout the development process by providing a layer of undeveloped resist. Frequently, when the resist is fully developed to the substrate, contamination or etching of the substrate surface may render it useless for subsequent reuse.

FIGS. 3 and 4 indicate that for a given resist thickness, the development time must be carefully adjusted. Conversely, for a given development time, the thickness variations must be maintained within a narrow range, illustratively, less than 5 nm. Rate of etching of exposed photoresist is nonlinearly related to the exposure. In general, increasing the photoresist exposure-development nonlinearly (i.e., increasing the exposure) and reducing the spot size will increase the tolerable thickness variation and the allowed development time error. Outside the closed boundary of the acceptable regions in FIG. 3, signal geometry fails for the following reasons. For a given development time, if the thickness is increased beyond the acceptable boundary, then the high frequency signal becomes shallow and the signal-amplitude-ratio specification cannot be met. As the thickness is further increased, eventually the depth of the low frequency signal goes out of limit. If, for a constant development time, the thickness is reduced below the acceptable boundary, the relative track drop (TD3) increases and then, with further thickness reduction, the track drop (TD1) also increases beyond its allowed range. Furthermore, if the thickness is sufficiently reduced, the signal-depth requirement cannot be met. All of these conclusions are fundamental consequences of the combined effects of the standing waves and of the nonlinearities present in the thin-resist exposure and development process.

A description of the theoretical considerations as described above is provided at pages 427–457 of RCA Review, Vol. 39, No. 3, September 1978.

In the aforementioned recording technique, a grooveless record master is produced. In some cases, for sample, where a stylus of the Clemens type is used during playback, it is desirable to produce a record master having a groove. As discussed above, it has been discovered that optical recording on resist coated, trapezoidally grooved record masters may produce unacceptable results due to the nonuniform response without using a thick resist coating and predistorting the signals to be recorded. Additionally, microscopic signal element non-uniformities may appear where the recording is effected on a trapezoidally grooved disc. These non-uniformities are caused by uncontrolled reflections of the light beam from the bottom and side walls of the groove. It has been discovered that it is possible to eliminate these undesirable nonuniformities by changing the groove geometry and substrate structure in such a manner that the phase of the interfering reflected wave is constant across the groove. A shallow cusp-shaped groove, coated conformally with a thin layer of resist with precisely controlled thickness, is one geometry which has provided excellent results, i.e., the signal element nonuniformities have been eliminated and the relative record response has been enhanced. It is difficult, however, to effect perfect conformal coating of the groove.

Figure 6:
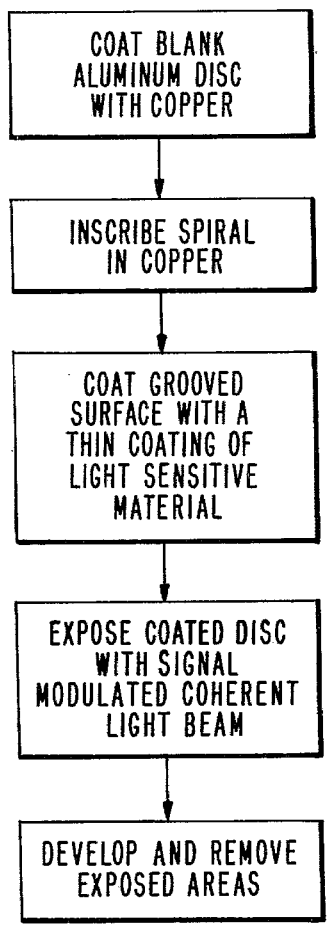
FIG. 6 is a flow diagram of one method in accordance with the present invention.

A method of optical recording on a cusp-shaped, grooved master disc which provides satisfactory results without perfectly conformally coating the substrate will be described with reference to FIGS. 6 and 7. A metal disc having a shallow cusp-shaped spiral groove on its surface is formed (see FIG. 7). The spiral groove, which has a typical pitch of 2000–9000 convolutions per inch, is cut into the metal disc with a smooth-radius-tipped tool. This metal disc may be formed in any of a number of ways. For example, one method of providing a grooved disc includes the steps of forming an aluminum blank about 14" in diameter and one-half inch thick, then, machining the disc flat to a tolerance of 0.0002". A coating of copper is thereafter formed on the flat surface to a thickness of about 0.003". The copper-coated disc is then placed in a jig bore lathe and the copper surface polished to form a smooth, flat disc. A diamond cutting stylus is thereafter utilized to inscribe a spiral groove having the desired pitch in the copper surface of the disc.

Subsequently a layer of radiant energy sensitive material or photoresist material is deposited on the grooved copper surface. A typical photoresist that has been successfully utilized in this application is Shipley No. AZ1350B photoresist. The photoresist material may be applied to the disc surface by any one of a number of techniques. In one technique the disc is spun at a rate in the range of about 200–2000 RPM (typically at about 450 RPM) while the radiant energy sensitive material of a viscosity of about 4.5 centipoise is applied (e.g. poured) on the grooved surface. The disc rotation throws off the excess of radiant energy sensitive material leaving a continuous coating over the grooved region of the disc.

Figure 7:
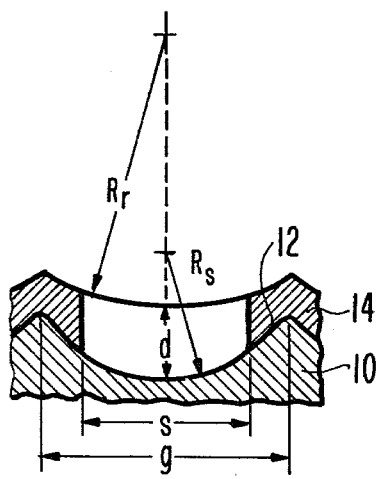
FIG. 7 is a cross-sectional representation of a cusp-shaped grooved disc that has been coated with a layer of radiant energy sensitive material.

Referring now to FIG. 7, a cross-section of the substrate 10 is shown having a cusp-shaped groove 12 where $R_s$ is the radius of curvature of the grooved bottom. After the photoresist 14 has dried, it will assume a radius of curvature as shown by $R_r$. The groove width and signal width in the radial direction of the disc master are denoted by g and s respectively. The resist thickness, which is thickest at the center of the groove, is denoted by d. Illustratively, a 5,555—grooves-per-inch disc format has typical dimensions of $R_s = .7$ microns, $R_r = 8$ microns, s = 3.5 microns and d in the range of 80–100 nm.

The groove geometry described with reference to FIG. 7 indicates that the resist does not coat the substrate conformally. Illustratively, the difference in resist thickness between that at groove center and at locations ±1.75 microns off center is approximately 30 nm. This differential thickness is outside of the range of allowable tolerance indicated in FIG. 3.

After the photoresist layer has been dried, the disc is positioned on a turntable under a coherent light source (e.g., helium-cadmium laser) for exposure by the coherent source. Disc rotation is set at about 450 RPM. During the signal information recording process, the light beam is precisely focused upon the disc providing a small spot size suitable for high resolution recording within the previously formed spiral groove. Illustratively, the spot size is approximately 350 nm. Intensity modulation of the light beam is utilized for recording the signal information on the disc master. Relative motion is established between the intensity modulated light beam and the disc surface such that the light beam is caused to successively traverse the grooved region of the disc exposing a pattern of elemental slots.

In the case of a nonconformally coated master disc as illustrated in FIG. 7, the systematic thickness variation across the grooves may be compensated for by appropriately shaping the recording-beam intensity profile. In one format a variable density filter is employed to shape the recording beam profile. In this format a filter which passes the coherent beam having the intensity undisturbed in the center and having the intensity off center reduced by an appropriate amount is interposed between the coherent source and the disc surface. By varying the intensity of the recording beam across the groove, the photoresist variation can be accommodated.

The exposed disc is then developed to remove photoresist material in the exposed regions on the disc. In the thickness range of interest for constant exposure, the thin regions develop faster than do the thick regions. Since the off-track-center beam intensity with respect to its on-center value has been reduced, the development time is chosen for the thick center region (see FIG. 3). Development may be carried out in Shipley No. AZ1350 Developer.

After the disc has been developed and the signal representative topography formed in the spiral groove, the disc is replicated in a material such as nickel. This nickel replica is a negative of the photoresist-coated disc and may be utilized to stamp or emboss vinyl records for use in a signal information playback system.

What is claimed is:

1. A method of recording information signals modulated within a given frequency range on a flat storage medium using a coherent light beam of a given wavelength focused onto the flat surface of said storage medium; said light beam being intensity modulated by said modulated information signals, said intensity modulated focused light beam having a spatial frequency response inadequate to provide sufficient signal-modulated-exposure in said given frequency range, wherein said incident coherent light beam interacts with the coherent light beam reflected from a surface of said storage medium to form an optical standing wave; comprising the steps of:

coating one surface of a reflective substrate with a uniform layer of nonlinear radiant energy sensitive material to a thickness greater than the first standing wave maximum of said optical standing wave in said radiant energy sensitive material but less than the first standing wave minimum of said optical standing wave in said radiant energy sensitive material;

moving said coated substrate relative to said intensity modulated coherent light beam thereby exposing said radiant energy sensitive material with said modulated coherent light beam in a pattern representative of said modulated information; and developing the radiant energy sensitive material exposed by the modulated light beam for a time period sufficient to form a track having geometric variations therein representative of the modulated information in said radiant energy sensitive material, the depth of said geometric variations at the high frequency end of said given frequency range being substantially equal to the depth of said geometric variations at the low frequency end of said given frequency range.

2. The method in accordance with claim 1 wherein said coherent light beam has a wavelength of approixmately 268 nm in said radiant energy sensitive material and wherein said radiant energy sensitive material is coated to a thickness of less than 134 nm.

3. A method of recording information signals modulated within a given frequency range on a storage medium using a coherent light beam of a given wavelength incident on a surface of said storage medium, wherein said incident coherent light beam interacts with the coherent light beam reflected from a surface of said storage medium to form an optical standing wave, comprising the steps of:
   forming on one surface of a substrate a groove having a cusp-shaped cross-section;
   conformally coating the grooved surface of said substrate with a uniform layer of nonlinear radiant energy sensitive material to a thickness greater than the first standing wave maximum of said optical standing wave in said radiant energy sensitive material but less than the first standing wave minimum of said optical standing wave in said radiant energy sensitive material;
   moving said coated substrate relative to said coherent light beam while simultaneously intensity modulating said coherent light beam with said modulated information signals thereby exposing said radiant energy sensitive material along said cusp-shaped groove with said intensity modulated coherent light beam in a pattern representative of said modulated information; and
   developing the radiant energy sensitive material exposed by the modulated light beam for a time period sufficient to form a track having geometric variations therein representative of the modulated information in said radiant energy sensitive material along said groove, the depth of said geometric variations at the high frequency end of said given frequency range being substantially equal to the depth of said geometric variations at the low frequency end of said given frequency range.

4. A method of recording information signals modulated within a given frequency range on a storage medium using a coherent light beam of a given wavelength incident on a surface of said storage medium, wherein said incident coherent light beam interacts with the coherent light beam reflected from a surface of said storage medium to form an optical standing wave, comprising the steps of:
   forming on one surface of a substrate a groove having a cusp-shaped cross-section;
   coating the grooved surface of said substrate with a layer of nonlinear radiant energy sensitive material said coating having a variable thickness across the cusp-shaped cross-section of said groove, said coating thickness being greater at the center than at the edges of said cross-section, the thickness of said coating at said center being greater than the first standing wave maximum of said optical standing wave in said radiant energy sensitive material but less than the first standing wave minimum of said optical standing wave in said radiant energy sensitive material;
   shaping the light beam intensity profile to compensate for the variation in the thickness of the radiant energy sensitive material;
   moving said coated substrate relative to said coherent light beam while simultaneously intensity modulating said coherent light beam with said modulated information signals thereby exposing said radiant energy sensitive material along said cusp-shaped groove with said intensity modulated coherent light beam in a pattern representative of said modulated information; and
   developing the radiant energy sensitive material exposed by the modulated light beam for a time period sufficient to form a track having geometric variations therein representative of the modulated information in the radiant energy sensitive material along said groove, the depth of said geometric variations at the high frequency end of said given frequency range being substantially equal to the depth of said geometric variations at the low frequency end of said given frequency range.

5. The method in accordance with claim 4 wherein said forming step comprises inscribing a spiral groove in a disc shaped substrate.

6. The method in accordance with claim 4 wherein said substrate is predominantly copper.

7. The method in accordance with claim 4 further comprising the step of coating a surface of the substrate with a layer of copper prior to said groove forming step.

8. The method in accordance with claim 4 wherein said shaping step comprises passing said coherent light beam through a variable density filter.

9. A method of recording information signals modulated within a given frequency range on a flat storage medium using a coherent light beam of a given wavelength focused onto the flat surface of said storage medium; said focused light beam being intensity modulated by said modulated information signals, said intensity modulated focused light beam having a spatial frequency response inadequate to provide sufficient signal-modulated-exposure in said given frequency range, wherein said incident coherent light beam interacts with the coherent light beam reflected from a surface of said storage medium to form an optical standing wave; comprising the steps of:
   coating one surface of a reflective substrate with a uniform layer of partially absorbing, nonlinear radiant energy sensitive material to a thickness greater than the second standing wave maximum of said optical standing wave in said radiant energy sensitive material but less than the second standing wave minimum of said optical standing wave in said radiant energy sensitive material;
   moving said coated substrate relative to said intensity modulated coherent light beam thereby exposing said radiant energy sensitive material with said modulated coherent light beam in a pattern representative of said modulated information; and
   developing the radiant energy sensitive material exposed by the modulated light beam for a time period sufficient to form a track having geometric variations therein representative of the modulated information in said radiant energy sensitive material, the depth of said geometric variations at the high frequency end of said given frequency range being substantially equal to the depth of said geometric variations at the low frequency end of said given frequency range.

10. A method of recording information signals modulated within a given frequency range on a storage medium using a coherent light beam of a given wavelength incident on a surface of said storage medium, wherein said incident coherent light beam interacts with the coherent light beam reflected from a surface of said storage medium to form an optical standing wave, comprising the steps of:

coating one surface of a substrate with a layer of non-linear radiant energy sensitive material to a thickness greater than the first standing wave maximum of said optical standing wave in said radiant energy sensitive material but less than the first standing wave minimum of said optical standing wave in said radiant energy sensitive material;

moving said coated substrate relative to said intensity modulated coherent light beam thereby exposing said radiant energy sensitive material with said modulated coherent light beam in a pattern representative of said modulated information; and developing the radiant energy sensitive material exposed by the modulated light beam for a time period sufficient to form a track having geometric variations therein representative of the modulated information in said radiant energy sensitive material, the depth of said geometric variations at the high frequency end of said given frequency range substantially equal to the depth of said geometric variations at the low frequency end of said given frequency range.

* * * * *